United States Patent [19]

Nawata et al.

[11] Patent Number: 5,215,863
[45] Date of Patent: Jun. 1, 1993

[54] RESIN COMPOSITION AND SOLDER RESIST COMPOSITION

[75] Inventors: Kazuyoshi Nawata, Onoda; Tetsuo Ohkubo, Ube; Minoru Yokoshima, Toride, all of Japan

[73] Assignee: Nippon Kayaku Kabushiki Kaisha, Tokyo, Japan

[21] Appl. No.: 774,389

[22] Filed: Oct. 11, 1991

Related U.S. Application Data

[63] Continuation of Ser. No. 397,448, Aug. 10, 1989, filed as PCT/JP88/01255, Dec. 12, 1988, abandoned.

Foreign Application Priority Data

Dec. 18, 1987 [JP] Japan .................. 62-318625

[51] Int. Cl.$^5$ .................................. G03F 7/033
[52] U.S. Cl. ................................ 430/280; 430/283; 430/285; 522/102; 522/109
[58] Field of Search ............ 430/280, 285, 283, 910; 522/102, 109

[56] References Cited

U.S. PATENT DOCUMENTS

| | | | |
|---|---|---|---|
| 3,887,450 | 6/1975 | Gilano et al. | 430/910 X |
| 3,989,610 | 11/1976 | Tsukada et al. | 430/280 X |
| 4,017,453 | 3/1977 | Heilman et al. | 260/42.18 |
| 4,601,973 | 7/1986 | Bauer | 430/280 |

FOREIGN PATENT DOCUMENTS

| | | |
|---|---|---|
| 0207188 | 1/1987 | European Pat. Off. |
| 280295 | 8/1988 | European Pat. Off. |
| 2324682 | 9/1977 | France |
| 57-30719 | 2/1982 | Japan |
| 57-59922 | 4/1982 | Japan |
| 59-68321 | 4/1984 | Japan |
| 60-80843 | 5/1985 | Japan |
| 2175908A | 12/1986 | United Kingdom |

OTHER PUBLICATIONS

WPIL, File Supplier, AN=88-054495, Derwent Publications Ltd., London, GB; (Mitsui Toatsu), Jan. 19, 1988.
WPIL, File Supplier, AN=86-116103, Derwent Publications Ltd., London, GB; (Mitsubishi), Mar. 22, 1986.
WPIL, File Supplier, AN=87-154194 Derwent Publications Ltd., London, GB; (Daicel), Apr. 27, 1987.

*Primary Examiner*—Marion E. McCamish
*Assistant Examiner*—C. D. RoDee
*Attorney, Agent, or Firm*—Nields & Lemack

[57] ABSTRACT

Disclosed herein is a resin composition or a solder resist resin composition comprising an epoxy resin (A) and/or an epoxy acrylate (B) obtained by reacting one chemical equivalent of epoxy groups in an epoxy resin with 0.1 to 1.0 chemical equivalent of acrylic acid, a styrene-maleic anhydride copolymer (C), an unsaturated group-containing compound (D) other than (B), and a photopolymerization initiator (E).

4 Claims, No Drawings

RESIN COMPOSITION AND SOLDER RESIST COMPOSITION

This application is a continuation of application Ser. No. 07/397,448 filed Aug. 10, 1989, now abandoned.

TECHNICAL FIELD

The present invention relates to a resin composition suitable for a solder resist ink excellent in heat resistance, chemical resistance and electrical insulation properties which is used as a permanent protective coat for printed boards.

BACKGROUND ART

Recently, UV-curing compositions have been widely used because of their suitability for resource- and energy saving, higher operability, higher productivity, etc. In the field of processing printed boards, also, UV-curing compositions have been becoming used in place of conventional thermosetting compositions used for various inks such as solder resist inks and marking inks, for the same reason. The solder resist inks have first come to be prepared by use of UV-curing compositions.

The use to which the UV-curing compositions are applied at present, however, is limited to the field of the so-called civil-use boards used in radio receivers, video recorders, TV sets, etc., and application of the UV-curing compositions to the field of the so-called industrial-use boards for computers, control apparatus, etc. has not yet been made This is because the solder resist inks to be used for the industrial-use boards are required to have high performance as to electrical insulation properties, solder heat resistance under humid conditions, plating resistance, etc., which are not required for the solder resist inks for the civil-use boards, and the solder resist inks available for the civil-use boards at present have not yet reached the level of the performance requirements. Due to the recent trend toward smaller size and higher functionality of electronic equipment and apparatus, the requirement for higher accuracy of circuit pattern density in the industrial-use boards also has become severe, and the screen printing process using the conventional UV-curing solder resist inks has not yielded a satisfactory result, because of the limitations of accuracy of printing.

Besides, the conventional UV-curing solder resist inks contain mono- to trifunctional monomers such as 2-hydroxyethyl methacrylate, trimethylolpropane triacrylate, etc. and various acrylate oligomers, etc., and these substances may bleed out on screen printing, to cause troubles such as failure in adhesion of the solder. There have been attempts to improve the above-mentioned difficulties. For instance, Japanese Patent Application Laid-Open (KOKAI) No. 60-208377(1985) proposes a resin composition comprising a photopolymerizable epoxy vinyl ester resin, a photopolymerization initiator and an amine-based epoxy hardener Though the resin composition is excellent in heat resistance, adhesion properties, chemical resistance and electrical insulation properties, the composition has drawbacks in that the storage stability is poor due to the use of the amine-based epoxy hardener, and there is need for development with a solvent.

DISCLOSURE OF INVENTION:

The present inventors, as a result of their earnest studies for solving the above-mentioned problems, have succeeded in providing a resin composition suitable for a solder resist ink excellent in heat resistance, adhesion properties, chemical resistance and electrical insulation characteristics which is capable of development by an aqueous alkali solution.

Namely, the present invention relates to:

(1) a resin composition comprising an epoxy resin (A) and/or an epoxy acrylate (B) obtained by reacting one chemical equivalent of epoxy groups in an epoxy resin with 0.1 to 1.0 chemical equivalent of acrylic acid, a styrene-maleic anhydride copolymer (C), an unsaturated group-containing compound (D) other than (B), and a photo-polymerization initiator (E); and (2) a solder resist resin composition comprising an epoxy resin (A) and/or an epoxy acrylate (B) obtained by reacting one chemical equivalent of epoxy groups in an epoxy resin with 0.1 to 1.0 chemical equivalent of acrylic acid, a styrene-maleic anhydride copolymer (C), an unsaturated group-containing compound (D) other than (B), and a photopolymerization initiator (E).

In the present invention, the epoxy resin (A) and/or the epoxy acrylate (B) is used, both being commercially available easily. For instance, the epoxy resin (A) may be a bisphenol type epoxy resin (e.g., Epikote-1001 and Epikote-1004, products by Shell Kagaku K.K.), a novolak type epoxy resin (e.g., Epikote-154 and Epikote-152, products by Shell Kagaku K.K.; EPPN-201 and EOCN-104, products by Nippon Kayaku K.K.), an alicyclic type epoxy resin (e.g., EHPE-3150, a product by Daicel Kagaku Kogyo K.K.) or the like. Among these resins, preferred is one which is solid at 40° C. The epoxy acrylate (B) obtained by reacting one chemical equivalent of epoxy groups in an epoxy resin with 0.1 to 1.0 chemical equivalent of acrylic acid may be, for example, an epoxy acrylate obtained by reacting one chemical equivalent of epoxy groups in the above-mentioned epoxy resin (A) with 0.1 to 1.0, preferably 0.3 to 0.6, chemical equivalent of acrylic acid. Among such epoxy acrylates, particularly preferred is one which is solid at 40° C.

The styrene-maleic anhydride copolymer (ordinarily, the content of maleic anhydride is 10 to 50 mol%) for use as the component (C) is commercially available easily. Examples of the styrene-maleic anhydride copolymer include SMA Resins (product name) SMA-1000 and SMA-2000, products by ARCO/chemical company, USA. The average molecular weight of the component (C) is preferably 500 to 10000, particularly 1000 to 3000.

The unsaturated group-containing compound for use as the component (D) may be, for example, a reaction product of a polybasic carboxylic anhydride with a reaction product of a novolak- or bisphenol-type epoxy resin and (meth)acrylic acid. Specific examples include those compounds which are obtained by a reaction wherein a reaction product (a) obtained by reacting a novolaktype epoxy resin, for instance, a phenol novolak type epoxy resin, a cresol novolak type epoxy resin, etc. with (meth)acrylic acid in such a ratio that the amount of (meth)acrylic acid is about 0.8 to 1.5, preferably 0.9 to 1.1, chemical equivalents per one chemical equivalent of epoxy groups in the epoxy resin, is reacted with a polybasic carboxylic anhydride, for instance, succinic anhydride, maleic anhydride, phthalic anhydride, hexahydrophthalic anhydride, tetrahydrophthalic anhydride, trimellitic anhydride, HET anhydride, methylhexahydrophthalic anhydride, methylendomethylenetetrahydrophthalic anhydride, chlorendic anhydride, etc. in such a ratio that the amount of the acid anhydride is 0.05 to 1.00 chemical equivalent per one chemical equivalent of hydroxyl groups in the reaction product (a). Other examples for the component (D) may include reactive monomers such as 2-hydroxyethyl (meth)acrylate, 2-hydroxypropyl (meth)acrylate, carbitol (meth)acrylate, phenoxyethyl (meth)acrylate, acryloylmorpholine, tripropylene glycol di(meth)acrylate, trimethylolpropane tri(meth)acrylate, trimethylolpropane tripropoxy tri(meth)acrylate, neopentyl glycol hydroxypivalate di(meth)acrylate, dioxane glycol di(meth)acrylate (KAYARAD R-640, a product by Nippon Kayaku K.K.), tris(hydroxyethyl)isocyanurate di(meth)acrylate, tris(hydroxyethyl)isocyanurate tri(meth)acrylate, pentaerythritol tri(meth)acrylate, dipentaerythritol hexa(meth)acrylate, dipentaerythritol penta(meth)acrylate, phosphoric ester of 2-hydroxyethyl (meth)acrylate, equimolar reaction products (half esters) of an acid anhydride, for instance, succinic anhydride, maleic anhydride, phthalic anhydride, hexahydrophthalic anhydride, tetrahydrophthalic anhydride, methylendomethylenetetrahydrophthalic anhydride, etc. with a hydroxyl-containing compound such as 2-hydroxyethyl (meth)acrylate, 2-hydroxypropyl (meth)acrylate, etc. Preferable examples of the component (D) include trimethylolpropane triacrylate, pentaerythritol triacrylate, tris(hydroxyethyl)isocyanurate diacrylate, neopentyl glycol hydroxypivalate diacrylate, carbitol acrylate, acryloylmorpholine, phosphoric ester of 2-hydroxyethyl (meth)acrylate, dipentaerythritol hexaacrylate, dipentaerythritol pentaacrylate, etc. The component (D) is not necessarily constituted of only one compound, but may be constituted of two or more compounds.

The term "(meth)acrylic acid" used herein means "acrylic acid or methacrylic acid", and the term "(meth)acrylate" used herein means "acrylate or methacrylate".

As the photopolymerization initiator (E), any of known photopolymerization initiators is usable, but it is preferable to use a photopolymerization initiator which has good storage stability after formulated. Examples of the photopolymerization initiator include benzoin alkyl ethers such as benzoin ethyl ether, benzoin isobutyl ether, etc.; acetophenones such as 2,2-diethoxyacetophenone, 4'-phenoxy-2,2-dichloroacetophenone, etc.; propiophenones such as 2-hydroxy-2-methylpropiophenone, 4'-isopropyl-2-hydroxy-2-methylpropiophenone, etc.; benzil dimethyl ketal; 1-hydroxycyclohexyl phenyl ketone; anthraquinones such as 2-ethylanthraquinone, 2-chloroanthraquinone, etc.; thioxanthones such as 2-chlorothioxanthone, 2,4-diethylthioxanthone, etc.; and 4,4'-diethylaminobenzophenone, isoamyl N,N-dimethylaminobenzoate, ethyl N,N-dimethylaminobenzoate, etc. One or more such photopolymerization initiators (E) may be used either singly or in combination in an arbitrary ratio. Preferable examples of the photopolymerization initiator (E) include, 4,4'-diethylaminobenzophenone, 2,4-diethylthioxanthone, a combination of 2,4-diethylthioxanthone with isoamyl N,N-dimethylaminobenzoate or ethyl N,N-dimethylaminobenzoate, etc.

The amounts of the components (A), (B), (C), (D) and (E) used in the resin composition and solder resist resin composition according to this invention are as follows. The amount of the component (A) is preferably 0 to 40% by weight, particularly 0 to 30% by weight, and the amount of the component (B) is preferably 0 to 40% by weight, particularly 0 to 30% by weight. The sum of the amount of the component (A) and the component (B) is preferably 5 to 50% by weight, particularly 5 to 40% by weight. The amounts of the component (A) and the component (B) are so selected as to satisfy all of the above-mentioned ranges. The amount of the component (C) is preferably 5 to 40% by weight, particularly 5 to 30% by weight. The amount of the component (D) is preferably 20 to 90% by weight, particularly 30 to 80% by weight. The amount of the component (E) is preferably 0.1 to 15% by weight, particularly 1 to 10% by weight.

If required, a heat-curing accelerator, for instance, tris(N,N-dimethylaminomethyl)phenol, benzylamine,2-ethyl-4-methylimidazole, etc. or a cationic photopolymerization catalyst, for instance, triphenylsulfonium hexafluoroantimonate, di(alkylphenol)phenylsulfonium hexafluoroantimonate, (2,4-cyclopentadiene-1-1-yl) [(1-methylethyl)benzene]-iron-hexafluorophosphate (Irgacure-261, a product by Ciba-Geigy Ltd.), etc. may be used in the resin composition according to the present invention.

Moreover, in consideration of operability, an organic solvent may also be used in the resin composition according to this invention. The organic solvent may be, for example, methyl ethyl ketone, butyl cellosolve acetate, butyl cellosolve, dipropylene glycol monomethyl ether, dipropylene glycol monoethyl ether or petroleum naphtha. Furthermore, various additives may be added to the resin composition. For instance, body pigment such as talc, silica, alumina, barium sulfate, magnesium oxide, etc.; thixotropic agent such as Aerosil, etc.; silicone- or fluorine-based leveling agent or defoaming agent; coloring agent or the like may be added.

The resin composition according to the present invention is particularly useful as a solder resist resin composition, and is also usable as a coating agent for metals such as copper, tinplate, aluminum, etc. The resin composition according to the present invention is cured by irradiation with UV rays by the usual method, followed by heating to a temperature of preferably 50 to 200° C., particularly, 100 to 170° C.

BEST MODE FOR CARRYING OUT THE INVENTION

The present invention will now be described in detail below while referring to examples, in which "parts" means "parts by weight".

Synthetic Examples of Epoxy Acrylate (B)

SYNTHETIC EXAMPLE 1

A mixture of 1870 parts (corresponding to 10 equivalents of epoxy groups) of a phenol novolak type epoxy resin having an epoxy equivalent of 187,"EPPN-201, softening point 65° C." (an epoxy resin, a product by Nippon Kayaku Co., Ltd.), 432 parts (corresponding to 6 equivalents of carboxyl groups) of acrylic acid, 1.15 parts of hydroquinone, 16.5 parts of triphenylstibine and 579.9 parts of butyl cellosolve was heated to 90° C., and reaction was continued for 13 hours, to obtain an epoxy acrylate (B-1) containing 20% of butyl cellosolve and having an acid value of 1 and an epoxy equivalent of 579.

SYNTHETIC EXAMPLE 2

A mixture of 2200 parts (corresponding to 10 equivalents of epoxy groups) of a cresol novolak type epoxy resin having an epoxy equivalent of 220, "EOCN-104, softening point 90° C." (an epoxy resin, a product by Nippon Kayaku Co., Ltd.), 288 parts (corresponding to 4 equivalents of carboxyl groups) of acrylic acid, 1.2 parts of hydroquinone, 17.9 parts of triphenylstibine and 626.8 parts of butyl cellosolve acetate was heated to 90° C., and reaction was continued for 10 hours, to obtain an epoxy acrylate (B-2) containing 20% of butyl cellosolve acetate and having an acid value of 1 and an epoxy equivalent of 417.5.

SYNTHETIC EXAMPLE 3

A mixture of 1870 parts of a phenol novolak type epoxy resin having an epoxy equivalent of 187, "EPPN-201, softening point 65° C." (an epoxy resin, a product by Nippon Kayaku Co., Ltd.), 720 parts of acrylic acid, 1.15 parts of hydroquinone, 16.5 parts of triphenylstibine and 2590 parts of trimethylolpropane triacrylate was heated to 95° C, and reaction was continued for 20 hours, to obtain an epoxy acrylate (B-3) containing 50% of trimethylolpropane triacrylate and having an acid value of 10.

Synthetic Examples of Reaction Product (D) of Polybasic Carboxylic Anhydride with Reaction Product of Novolak Type Epoxy Resin with (Meth)acrylic Acid

SYNTHETIC EXAMPLE 4

A mixture of 1796.0 parts (corresponding to 10 equivalents of epoxy groups) of a phenol novolak type epoxy resin having an epoxy equivalent of 179.6, "Epikote-154" (an epoxy resin, a product by Shell Kagaku K.K.), 720 parts (corresponding to 10 equivalents of carboxyl groups) of acrylic acid, 1407 parts of butyl cellosolve acetate, 1.26 parts of methylhydroquinone and 25.9 parts of triphenylstibine was heated to 95° C, and was reacted for 20 hours. After addition of 740.6 parts of phthalic anhydride to the reaction mixture, the resultant admixture was reacted for 20 hours, to obtain a reaction product (D-1) having a viscosity (25° C.) of 29000 cps and an acid value (for components exclusive of solvent) of 86.0 mgKOH/g.

SYNTHETIC EXAMPLE 5

In the same manner as in Synthetic Example 4 except that 740.6 parts of phthalic anhydride and 1407 parts of butyl cellosolve acetate used in Synthetic Example 4 were replaced by 760.6 parts of tetrahydrophthalic anhydride and 1415.8 parts of butyl cellosolve acetate, a reaction product (D-2) was obtained, which had a viscosity (25° C.) of 12500 cps and an acid value (for components exclusive of solvent) of 85.5 mgKOH/g.

EXAMPLES 1 to 5

Solder resist resin compositions were formulated by blending epoxy resins, the epoxy acrylates obtained in Synthetic Examples 1 to 3, the reaction products obtained in Synthetic Examples 4 and 5, styrene-maleic anhydride copolymers, photopolymerization initiators, unsaturated group-containing compounds, organic solvents, talc and Cyanine Geen in the blending ratios shown in Table 1. Each of the solder resist resin compositions was applied to a copper through-hole printed board in a film thickness of 20 to 100 μm by a screen printing method or a roll coater method, followed by drying at 70° C. for 60 minutes when the resin composition contains a solvent. The coat thus obtained is then irradiated with UV rays from a 5-kW superhigh pressure mercury lamp through a negative film, and the unirradiated portions of the coat were dissolved away by an aqueous alkali solution such as a 2% aqueous Na$_2$CO$_3$ solution. After 30 minutes of thermal cure at 150° C. in a hot-air dryer, each of the thus obtained specimens was served to various performance tests. The results are set forth in Table 1. The performance tests shown in the table were carried out as follows.

Solubility

The coat was irradiated with UV rays by use of a 5-kW superhigh pressure mercury lamp, then unirradiated portions of the coat were dissolved away by a 2% aqueous Na$_2$CO$_3$ solution at 30° C., and the solubility of the coat was judged.

.. ... Dissolved rapidly.

X .. ... Not dissolved, or dissolved extremely slowly.

Solder Resistance

The state of the coat after immersed in a molten solder at 260° C. for 1 minute was judged.

.. ... Normal appearance.

.. ... Blistering, melting, peeling.

Adhesion

The coat on the specimen was provided with 100 cross-cuts 1×1 mm in size, and peeled by use of cellophane tape to evaluate the adhesive properties.

Insulation Resistance

The coat was left to stand in an atmosphere of 80° C. and 95% RH for 240 hours, and the insulation resistance of the coat was measured.

TABLE 1

| | Examples | | | | |
|---|---|---|---|---|---|
| | 1 | 2 | 3 | 4 | 5 |
| Blending Ratio (parts) | | | | | |
| EOCN-104 *1 | | 1 | | | |
| EHPE-3150 *2 | | | | 1 | |
| B-1 | 1.1 | | 1.0 | 1.0 | |
| B-2 | | | 1.0 | | |
| B-3 | | | | | 1.5 |
| D-1 | | 5.2 | | | |
| D-2 | | | | 5.2 | |
| Pentaerythritol triacrylate | 1.0 | 0.9 | | | 1.05 |
| Neopentyl glycol hydroxypivalate diacrylate | | | | | 1.0 |

TABLE 1-continued

|  | Examples | | | | |
|---|---|---|---|---|---|
|  | 1 | 2 | 3 | 4 | 5 |
| Kayamer PM2 *7 |  |  |  |  | 0.1 |
| Tris(hydroxyethyl) isocyanurate diacrylate | 3.0 |  | 3.0 |  |  |
| Carbitol acrylate | 0.5 |  | 1.4 | 0.9 |  |
| SMA-Resin 1000 *3 | 1.75 | 0.75 | 1.75 | 1.25 | 0.75 |
| SMA-Resin 2000 *4 |  | 0.5 |  |  |  |
| Butyl cellosolve acetate |  | 1.5 |  | 2 |  |
| DETX *5 | 0.3 | 0.3 | 0.3 | 0.3 | 0.33 |
| EPA *6 | 0.3 | 0.3 | 0.3 | 0.3 | 0.67 |
| Triphenylsulfonium hexafluoroantimonate |  | 0.04 |  |  |  |
| Talc | 3.5 | 3.5 | 3.5 | 3.5 | 2.2 |
| Cyanine Green | 0.07 | 0.07 | 0.07 | 0.07 | 0.05 |
| Solubility | ○ | ○ | ○ | ○ | ○ |
| Solder resistance | ○ | ○ | ○ | ○ | ○ |
| Adhesion | 100/100 | 100/100 | 100/100 | 100/100 | 100/100 |
| Insulation resistance (Ω) | $1.1 \times 10^{12}$ | $1.0 \times 10^{12}$ | $1.3 \times 10^{12}$ | $1.5 \times 10^{12}$ | $2.1 \times 10^{12}$ |

Notes:
*1 Cresol novolak type epoxy resin, a product by Nippon Kayaku K.K.
*2 Alicyclic epoxy resin, a product by Daicel Kagaku Kogyo K.K.
*3 ⎫ Styrene-maleic anhydride copolymer, a product
*4 ⎭ by ARCO/chemical company.
*5 Diethylthioxanthone, a photopolymerization initiator, a product by Nippon Kayaku K.K.
*6 Ethyl N,N-Dimethylaminobenzoate, a photopolymerization accelerator, a product by Nippon Kayaku K.K.
*7 Phosphoric ester of 2-Hydroxyethyl methacrylate, a product by Nippon Kayaku K.K.

INDUSTRIAL APPLICABILITY

The composition according to the present invention is suitable for a solder resist capable of development by an aqueous alkali solution and excellent in heat resistance, solvent resistance, adhesive properties and electrical insulation properties.

We claim:

1. A resin comprising (1) an epoxy resin (A) and/or an epoxy acrylate (B) obtained by reacting one chemical equivalent of epoxy groups in an epoxy resin with 0.1 to 1.0 chemical equivalent of acrylic acid, (2) a styrene-maleic anhydride copolymer (C), (3) an unsaturated group-containing compound (D) selected from the group consisting of a reaction product of a polybasic carboxylic anhydride with a reaction product of a novolak- or bisphenol-type epoxy resin with (meth)acrylic acid; carbitol (meth)acrylate; neopentyl glycol hydroxpivalate di(meth)acrylate; tris(hydroxyethyl)isocyanurate di or tri(meth)acrylate; pentaerythritol tri(meth)acrylate; and phosphoric ester of 2-hydroxyethyl (meth)acrylate, and (4) a photo-polymerization initiator (E).

2. A solder resist resin composition comprising (1) an epoxy resin (A) and/or an epoxy acrylate (B) obtained by reacting one chemical equivalent of epoxy groups in an epoxy resin with 0.1 to 1.0 chemical equivalent of acrylic acid, (2) a styrene-maleic anhydride copolymer (C), (3) an unsaturated group-containing compound (D) selected from the group consisting of
   a reaction product of a polybasic carboxylic anhydride with a reaction product of a novolak-or bisphenol-type epoxy resin with (meth)acrylic acid;
   carbitol (meth)acrylate;
   neopentyl glycol hydroxypivalate di(meth)acrylate;
   tris(hydroxyethyl)isocyanurate di or tri(meth)acrylate;
   pentaerythritol tri(meth)acrylate; and
   phosphoric ester of 2-hydroxyethyl (meth)acrylate, and (4) a photo-polymerization initiator (E).

3. A resin composition according to claim 1 or 2, wherein the amount of the component (A) is 0 to 40% by weight, the amount of the component (B) is 0 to 40% by weight, the sum of the amount of the component (A) and the component (B) is 5 to 50% by weight, the amount of the component (C) is 5 to 40% by weight, the amount of the component (D) is 20 to 90% by weight, and the amount of the component (E) is 0.1 to 15% by weight.

4. A resin composition according to claim 1 or 2, wherein the component (A) and/or the component (B) is solid at 40° C.

* * * * *